United States Patent
Kumar et al.

(10) Patent No.: US 11,764,058 B2
(45) Date of Patent: Sep. 19, 2023

(54) THREE-COLOR 3D DRAM STACK AND METHODS OF MAKING

(71) Applicant: Applied Materials, Inc., Santa Clara, CA (US)

(72) Inventors: Arvind Kumar, Austin, TX (US); Mahendra Pakala, Saratoga, CA (US); Ellie Y. Yieh, San Jose, CA (US); John Tolle, Gilbert, AZ (US); Thomas Kirschenheiter, Tempe, AZ (US); Anchuan Wang, San Jose, CA (US); Zihui Li, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 129 days.

(21) Appl. No.: 17/487,596

(22) Filed: Sep. 28, 2021

(65) Prior Publication Data

US 2023/0102558 A1    Mar. 30, 2023

(51) Int. Cl.
| | |
|---|---|
| *H01L 21/02* | (2006.01) |
| *H01L 29/06* | (2006.01) |
| *H01L 29/786* | (2006.01) |
| *H01L 29/66* | (2006.01) |
| *H01L 21/306* | (2006.01) |
| *H10B 12/00* | (2023.01) |

(52) U.S. Cl.
CPC .... *H01L 21/02532* (2013.01); *H01L 21/0259* (2013.01); *H01L 21/0262* (2013.01); *H01L 21/02579* (2013.01); *H01L 21/30604* (2013.01); *H01L 29/0665* (2013.01); *H01L 29/66742* (2013.01); *H01L 29/78696* (2013.01); *H10B 12/05* (2023.02); *H10B 12/30* (2023.02)

(58) Field of Classification Search
CPC .......... H01L 21/02381; H01L 21/0245; H01L 21/02532; H01L 21/02579; H01L 21/0259; H01L 21/0262; H01L 21/30604; H01L 29/0665; H01L 29/66742; H01L 29/66795; H01L 29/785; H01L 29/78696; H10B 12/01; H10B 12/05; H10B 12/056; H10B 12/30; H10B 12/36; H10B 12/37; H10B 12/395
See application file for complete search history.

(56) References Cited

U.S. PATENT DOCUMENTS

| | | |
|---|---|---|
| 6,656,809 B2 | 12/2003 | Greenberg et al. |
| 8,575,655 B2 | 11/2013 | Bedell et al. |
| 9,087,901 B2 | 7/2015 | Chen |
| 9,443,963 B2 | 9/2016 | Kerber et al. |
| 2010/0038727 A1 | 2/2010 | Chakravarthi et al. |
| 2015/0311293 A1 | 10/2015 | Mishra et al. |
| 2017/0125523 A1* | 5/2017 | Balakrishnan ............... H01L 21/823871 |
| 2018/0026101 A1 | 1/2018 | Jagannathan et al. |

(Continued)

OTHER PUBLICATIONS

PCT International Search Report and Written Opinion in PCT/US2022/044990 dated Jan. 19, 2023, 10 pages.

*Primary Examiner* — Cheung Lee
(74) *Attorney, Agent, or Firm* — Servilla Whitney LLC

(57) ABSTRACT

Methods of reducing wafer bowing in 3D DRAM devices are described using a 3-color process. A plurality of film stacks are formed on a substrate surface, each of the film stacks comprises two doped SiGe layers having different dopant amounts and/or Si:Ge ratios and a doped silicon layer. 3D DRAM devices are also described.

20 Claims, 1 Drawing Sheet

(56) References Cited

U.S. PATENT DOCUMENTS

| | | |
|---|---|---|
| 2020/0006376 A1 | 1/2020 | Makala et al. |
| 2020/0083225 A1 | 3/2020 | Ma et al. |
| 2020/0212041 A1 | 7/2020 | Machkaoutsan et al. |
| 2020/0227418 A1 | 7/2020 | Kim et al. |
| 2021/0175069 A1 | 6/2021 | Hikavyy et al. |
| 2021/0249415 A1 | 8/2021 | Kang et al. |

* cited by examiner

THREE-COLOR 3D DRAM STACK AND METHODS OF MAKING

TECHNICAL FIELD

Embodiments of the disclosure generally relate to 3D DRAM stacks and methods for forming 3D DRAM devices. In particular, embodiment of the disclosure pertains to methods of forming 3D DRAM devices using a 3-color process.

BACKGROUND

There is interest in increasing the bit density of memory devices in the semiconductor manufacturing industry. One approach to fabricate 3D DRAM devices involves epitaxially growing a multi-layer stack comprising an epitaxial silicon channel layer and two or more sacrificial epitaxial layers. Subsequent process steps require recessing of the sacrificial layers to form access gates and capacitors.

To scale the density of the 3D DRAM beyond the 10 nm node, the number of stacks of silicon channel and sacrificial layers needs to be increased to more than 100, which can result in 400 epitaxial layers. One issue with increasing the number of layers is wafer bowing when the stacks increase to greater than 150 µm. It is believed that a lattice mismatch induced stress in the silicon channel/sacrificial layer stack results in this wafer bowing. Typically, wafer bow greater than 150 µm will prevent subsequent processes, such as lithography, from being accurately performed.

During device formation, the sacrificial layer(s) are selectively etched relative to the silicon channels. Conventionally engineered layer stacks designed to reduce the wafer bowing results in a decrease in etch selectivity.

Current state of the art processes require additional deposition of stress relieving films at the back side of the wafer to counteract the wafer bowing. This only partially alleviates the wafer bow issue as the bowing returns when a top stack is etched or during thermal processes. Additionally, removing the back side film increase process complexity and costs.

Accordingly, there is a need for 3D DRAM devices and methods of forming 3D DRAM devices with decreased wafer bowing and/or improved etch selectivity.

SUMMARY

One or more embodiments of the disclosure are directed to methods for reducing wafer bowing in 3D DRAM devices. A plurality of film stacks are formed on a substrate surface. Each of the film stacks comprises a first doped SiGe layer, a second doped SiGe layer and a doped silicon layer. The first doped SiGe layer has an empirical formula $Si_{1-x}Ge_x$, where x is in the range of greater than >0 to 0.5. The second doped SiGe layer is on the first doped SiGe layer and has an empirical formula $S_{1-y}Ge_y$, where y is in the range of >0 to 0.5. The doped silicon layer is on the second doped SiGe layer. The first doped SiGe layer and second doped SiGe layer have one or more of different doping amounts or different Si:Ge ratios.

Additional embodiments of the disclosure are directed to methods of making a 3D DRAM device. At least 100 film stacks are formed on a substrate surface. Each of the film stacks comprises a first doped SiGe layer, a second doped SiGe layer and doped silicon layer. The first doped SiGe layer has an empirical formula $Si_{1-x}Ge_x$, where x is in the range of greater than >0 to 0.5. The second doped SiGe layer is on the first doped SiGe layer and has an empirical formula $Si_{1-y}Ge_y$, where y is in the range of >0 to 0.5. The first doped SiGe layer and second doped SiGe layer have one or more of different doping amounts or different Si:Ge ratios. The doped silicon layer is on the second doped SiGe layer. A channel is formed through the film stacks to the substrate. One or more of the first doped SiGe layer or second doped SiGe layer is selectively removed through the channel.

Further embodiments of the disclosure are directed to methods of making a 3D DRAM device with reduced wafer bowing. At least 100 film stacks are formed on a substrate surface. Each of the film stacks comprises an epitaxially grown first doped SiGe layer, an epitaxially grown second doped SiGe layer and an epitaxially grown doped silicon layer. The epitaxially grown first doped SiGe layer has an empirical formula $Si_{1-x}Ge_x$, where x is in the range of greater than >0 to 0.5. The epitaxially grown second doped SiGe layer is on the first doped SiGe layer and has an empirical formula $S_{1-y}Ge_y$, where y is in the range of >0 to 0.5. The first doped SiGe layer and second doped SiGe layer have one or more of different doping amounts or different Si:Ge ratios. The epitaxially grown doped silicon layer is on the second doped SiGe layer. The first doped SiGe layer, second doped SiGe layer and doped silicon layer independently comprise a dopant selected from carbon or boron in the range of 0.5-2.5%. A stress of the second doped SiGe layer is more tensile than a stress of the first doped SiGe layer, and the stress of the first doped SiGe layer is more tensile than a stress of the Si layer. Each of the first doped SiGe layer, the second doped SiGe layer and the doped silicon layer have an etch selectivity relative to the other layers by greater than 200:1 when using halide-based etchants. A channel is formed through all of the stacks to the substrate surface by lithography. One or more of the first doped SiGe layers or second doped SiGe layers are selectively etched from all of the film stacks through the channel.

BRIEF DESCRIPTION OF THE DRAWINGS

So that the manner in which the features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
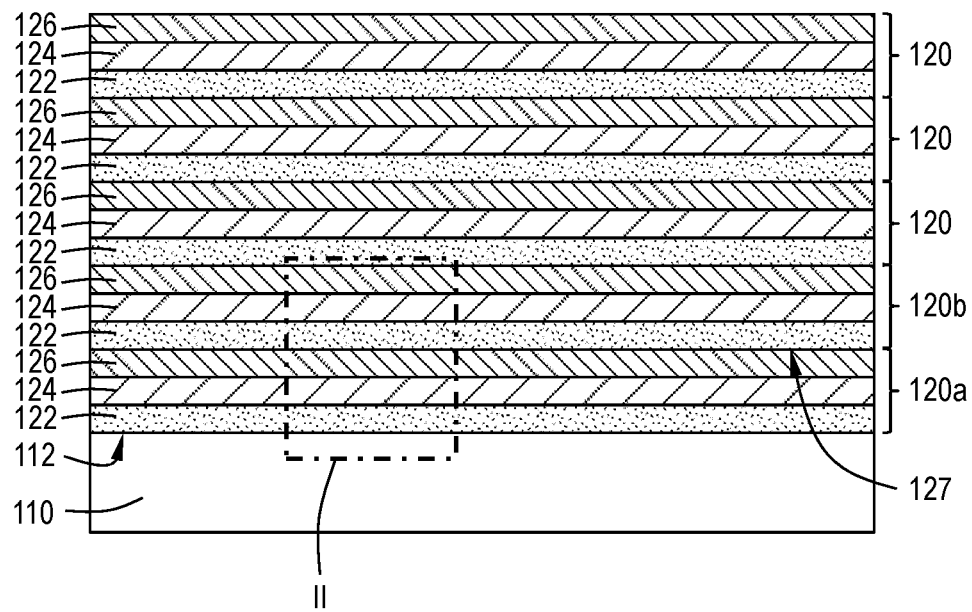
FIG. 1 shows a schematic representation of a 3D DRAM device during formation by a 3-color process according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface for further processes.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

One or more embodiments of the disclosure advantageously provide 3-color methods for forming 3D DRAM devices with film stacks having decreased or neutral bow. As used in this manner, a 3-color process means that there are three etch selective materials used. Some embodiments advantageously provide 3D DRAM film stacks comprising epitaxial silicon (Si) and silicon germanium (SiGe) with decreased or neutral bow. Some embodiments advantageously provide epi Si/SiGe stacks with decreased bow using carbon (C) or boron (B) doping.

Figure 2:
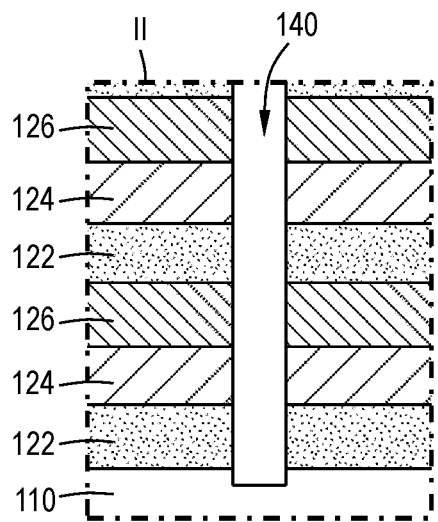
FIG. 2 shows an expanded view of region II of FIG. 1 after formation of a channel through the film stacks.
Figure 3:
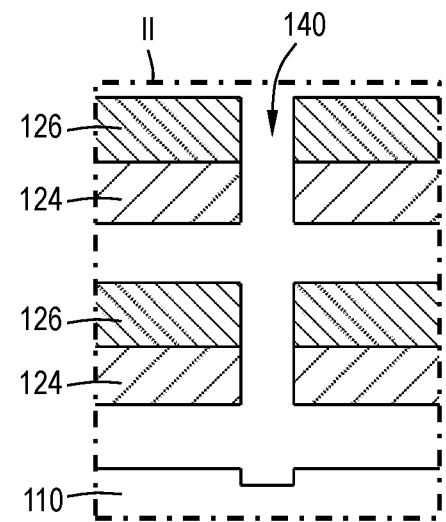
FIG. 3 shows the expanded view of FIG. 2 after selectively removing one of layers of the 3-color process.

Referring to FIGS. 1 through 3, one or more embodiments of the disclosure are directed to methods for reducing wafer bowing in 3D DRAM devices 100 using a 3-color process. A plurality of film stacks 120 are formed on a substrate 110 having a substrate surface 112. The film stacks 120 may also be referred to as 3-color stacks. The embodiment illustrated in FIG. 1 shows five film stacks 120 (including films stacks 120a, 120b). The skilled artisan will recognize that this is merely representative and that there can be more or less film stacks 120. In some embodiments, there are greater than 50, 100, 150 or 200 film stacks 120.

At least some of the film stacks 120, or each of the film stacks 120, comprises a first doped SiGe layer 122, a second doped SiGe layer 124 and a doped silicon layer 126. The skilled artisan will recognize that the first doped SiGe layer 122 in the first stack 120a is formed on the substrate surface 112, or directly on the substrate surface 112. The first doped SiGe layers 122 of subsequent film stacks 120b are formed on the surface 127 of the doped silicon layer 126 of the previous film stack 120a, or directly on the surface 127 of the doped silicon layer 126 of the previous film stack 120a.

The first doped SiGe layer 122 has an empirical formula $Si_{1-x}Ge_x$. In some embodiments, x is in the range of greater than 0 (>0) to 0.5. In some embodiments, x is in the range of greater than 0 to 0.4, or in the range of greater than 0 to 0.3, or in the range of greater than 0 to 0.2. In some embodiments, x is in the range of 0.05, 0.1, 0.15, 0.2 or 0.25 to 0.5.

The first doped SiGe layer 122 comprises a dopant with a concentration in the range of 0.5 atomic % to 2.5 atomic %. In some embodiments, the first doped SiGe layer 122 has a dopant concentration in the range of 0.5, 0.6, 0.7, 0.8, 0.9, 1.0, 1.1, 1.2, 1.3, 1.4 or 1.5 atomic % to 2.5 atomic %. In some embodiments, the first doped SiGe layer 122 has a dopant concentration in the range of 0.5 atomic % to 1.5, 1.6, 1.7, 1.8, 1.9, 2.0, 2.1, 2.2, 2.3, 2.4 or 2.5 atomic %.

The second doped SiGe layer 124 has an empirical formula $Si_{1-y}Ge_y$. In some embodiments, y is in the range of greater than 0 to 0.5. In some embodiments, y is in the range of greater than 0 to 0.4, or in the range of greater than 0 to 0.3, or in the range of greater than 0 to 0.2. In some embodiments, x is in the range of 0.05, 0.1, 0.15, 0.2 or 0.25 to 0.5. In some embodiments, x from the first doped layer 122 and y of the second doped layer 124 are different by greater than or equal to 0.1, 0.2, 0.3, 0.4 or 0.5. In some embodiments, x is greater than y. In some embodiments, y is greater than x.

The second doped SiGe layer 124 comprises a dopant with a concentration in the range of 0.5 atomic % to 2.5 atomic %. In some embodiments, the second doped SiGe layer 124 has a dopant concentration in the range of 0.5, 0.6, 0.7, 0.8, 0.9, 1.0, 1.1, 1.2, 1.3, 1.4 or 1.5 atomic % to 2.5 atomic %. In some embodiments, the second doped SiGe layer 124 has a dopant concentration in the range of 0.5 atomic % to 1.5, 1.6, 1.7, 1.8, 1.9, 2.0, 2.1, 2.2, 2.3, 2.4 or 2.5 atomic %.

The doped silicon layer 126 comprises a dopant with a concentration in the range of 0.5 atomic % to 2.5 atomic %. In some embodiments, the doped silicon layer 126 has a dopant concentration in the range of 0.5, 0.6, 0.7, 0.8, 0.9, 1.0, 1.1, 1.2, 1.3, 1.4 or 1.5 atomic % to 2.5 atomic %. In some embodiments, the doped silicon layer 126 has a dopant concentration in the range of 0.5 atomic % to 1.5, 1.6, 1.7, 1.8, 1.9, 2.0, 2.1, 2.2, 2.3, 2.4 or 2.5 atomic %.

The dopant in any of the first doped SiGe layer 122, second doped SiGe layer 124 or doped silicon layer 126 can be any suitable dopant known to the skilled artisan. In some embodiments, the dopant comprises a Group III-V element. In some embodiments, the dopant comprises one or more of carbon or boron. In some embodiments, the dopant consists essentially of one or more of carbon or boron. As used in this manner, the term "consists essentially of" means that the composition of the subject component is greater than or equal to 95%, 98%, 99% or 99.5% of the stated material. For example, a dopant consisting essentially of carbon and/or boron means that out of all dopant atoms, greater than or equal to 95% are carbon or boron. In some embodiments, the dopant comprises or consists essentially of carbon. In some embodiments, the dopant comprises or consists essentially of boron.

In some embodiments, the first doped SiGe layer and second doped SiGe layer independently comprise a dopant in the range of 0.5-2.5%. In some embodiments, the first doped SiGe, layer second doped SiGe layer and doped silicon layer independently comprise a dopant in the range of 0.5-2.5%. The dopant can be the same or different in the different layers In some embodiments, x of the first doped SiGe layer 122 and y of the second doped SiGe layer 124 are the same or within 0.1 of each other and the dopant concentration in each of the first doped SiGe layer 122 and the second doped SiGe layer 124 are different by greater than or equal to 0.1, 0.2, 0.3, 0.4, 0.5, 0.6, 0.7, 0.8, 0.9 or 1.0 atomic percent.

The various layers described can be formed by any suitable technique known to the skilled artisan. For example, one or more of the films can be formed by epitaxial growth, chemical vapor deposition, atomic layer deposition, physical vapor deposition, ion implantation, etc. In some embodiments, each of the first doped SiGe layer 122, the second doped SiGe layer 124 and the doped silicon layer 126 are epitaxially grown. In some embodiments, each of the first doped SiGe layer 122, the second doped SiGe layer 124 and the doped silicon layer 126 are independently grown at a temperature in the range of 500 C to 800 C.

The stress of the film stack 120 is modulated by the doped layers. In some embodiments, the stress of the second doped SiGe layer 124 is more tensile than the stress of the first doped SiGe layer 122. The stress of the film stack 120 is modulated by the doped layers. In some embodiments, the stress of the second doped SiGe layer 124 is more tensile than the stress of the first doped SiGe layer 122, and the stress of the first doped SiGe layer 122 is more tensile than the stress of the doped silicon layer 126. In some embodiments, the stress of the first doped SiGe layer 122 and the second doped SiGe layer 124 are more tensile than the stress of the doped silicon layer 126.

In some embodiments, the overall bowing of the wafer is neutral after formation of 100 film stacks 120. In some embodiments, the overall bowing of the wafer is neutral after formation of 125, 150, 175 or 200 film stacks 120. As used in this manner, the term "neutral" means that there is less than or equal to 150 μm, 125 μm, 100 μm, 75 μm, 50 μm or 25 μm bow across the wafer surface. Some embodiments provide a method of doping epi films in a controlled manner to result in reduced wafer bow of ~30 μm for 1 μm talk stack making a 5 μm DRAM stack, or greater, possible.

In the 3-color process illustrated in the Figures, the first doped SiGe layer 122 and second doped SiGe layer 124 are different from each other in a manner than makes the two etch elective relative to each other. In some embodiments, the first doped SiGe layer 122 and second doped SiGe layer 124 have similar Si:Ge ratios with different levels of doping. In some embodiments, the first doped SiGe layer 122 and the second doped SiGe layer 124 have similar doping levels and different Si:Ge ratios. Stated differently, in some embodiments, the first doped SiGe layer 122 and second doped SiGe 124 layer have one or more of different doping amounts or different Si:Ge ratios.

The doped first SiGe layer 122, second doped SiGe layer 124 and doped silicon layer 126 are etch selective relative to each other. In some embodiments, the first doped SiGe layer 122 and the doped silicon layer 126 have an etch selectivity greater than 200:1 when using a halide-based etchant (e.g., 1% HF, $NF_3$ plasma). Halide-based etchants include wet or vapor-phase etchants. In some embodiments, the halide-based etchant is a vapor-phase etchant comprising fluorine atoms. In some embodiments, the second doped SiGe layer 124 and the doped silicon layer 126 have an etch selectivity greater than 200:1 when using a halide-based etchant. In some embodiments, the first doped SiGe layer 122 and second doped SiGe layer 124 have an etch selectivity greater than 200:1 when using a halide-based etchant. In some embodiments, each of the first doped SiGe layer 122, the second doped SiGe layer 124 and the doped silicon layer 126 have an etch selectivity relative to the other layers by greater than 200:1 when using halide-based etchants.

While the embodiments and illustrations discuss a 3-color method, the skilled artisan will recognize that the doped Si and doped SiGe layers can be arranged to provide a 4-color or more system. The additional colors (SiGe layers) are etch selective compared to the first doped SiGe layer 122, second doped SiGe layer 124 and doped silicon layer 126 by one or more of different dopant amounts or different Si:Ge ratios.

FIGS. 2 and 3 illustrate a portion of the 3D DRAM device 100 of FIG. 1 at region II. In some embodiments of the method further comprise forming a channel 140 through all of the film stacks 120 to the substrate surface 112 (or a distance into the substrate 110) by lithography. The skilled artisan will understand how to form the channel 140 using lithography. After formation of the channel 140, one or more of the first doped SiGe layer 122 or second doped SiGe layer 124 is selectively etched from the film stacks 120 through the channel 140. FIG. 3 shows the first doped SiGe layer 122 removed, leaving the second doped SiGe layer 124 and doped silicon layer 126. The skilled artisan will understand that the second doped SiGe layer 124 can be removed through channel 140 while leaving the first doped SiGe layer 122 and doped silicon layer 126.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of reducing wafer bowing in 3D DRAM devices, the method comprising:
    forming a plurality of film stacks on a substrate surface, each of the film stacks comprising:
        a first doped SiGe layer having an empirical formula $Si_{1-x}Ge_x$, where x is in the range of greater than >0 to 0.5;

a second doped SiGe layer on the first doped SiGe layer, the second doped SiGe layer having an empirical formula $S_{1-y}Ge_y$, where y is in the range of >0 to 0.5; and a doped silicon layer on the second doped SiGe layer, wherein the first doped SiGe layer and second doped SiGe layer have one or more of different doping amounts or different Si:Ge ratios.

2. The method of claim 1, wherein the first doped SiGe layer comprises a dopant in the range of 0.5-2.5%.

3. The method of claim 2, wherein the dopant is a Group III-V element.

4. The method of claim 3, wherein the dopant is one or more of carbon or boron.

5. The method of claim 1, wherein the second doped SiGe layer comprises a dopant in the range of 0.5-2.5%.

6. The method of claim 5, wherein the dopant is a Group III-V element.

7. The method of claim 6, wherein the dopant is one or more of carbon or boron.

8. The method of claim 1, wherein the doped silicon layer comprises a dopant in the range of 0.5-2.5%.

9. The method of claim 1, wherein each of the first doped SiGe layer, the second doped SiGe layer and the doped silicon layer are epitaxially grown.

10. The method of claim 9, wherein each of the first doped SiGe layer, the second doped SiGe layer and the doped silicon layer are independently grown at temperatures in the range of 500 C to 800 C.

11. The method of claim 1, wherein a stress of the second doped SiGe layer is more tensile than a stress of the first doped SiGe layer, and the stress of the first doped SiGe layer is more tensile than a stress of the doped silicon layer.

12. The method of claim 1, wherein the wafer bows by an amount less than 150 µm when there are 100 film stacks.

13. The method of claim 1, wherein each of the first doped SiGe layer, the second doped SiGe layer and the doped silicon layer have an etch selectivity relative to the other layers by greater than 200:1 when using halide-based etchants.

14. The method of claim 1, further comprising forming a channel through all of the stacks to the substrate surface by lithography; and selectively etching one or more of the first doped SiGe layers or second doped SiGe layers from all of the film stacks through the channel.

15. The method of claim 1, wherein the wafer bows by an amount less than 150 µm when there are 100 film stacks.

16. A method of making a 3D DRAM device, the method comprising:

forming at least 100 film stacks on a substrate surface, each of the film stacks comprising:

a first doped SiGe layer having an empirical formula $Si_{1-x}Ge_x$, where x is in the range of greater than >0 to 0.5;

a second doped SiGe layer on the first doped SiGe layer, the second doped SiGe layer having an empirical formula $S_{1-y}Ge_y$, where y is in the range of >0 to 0.5, the first doped SiGe layer and second doped SiGe layer have one or more of different doping amounts or different Si:Ge ratios;

a doped silicon layer on the second doped SiGe layer; and forming a channel through the film stacks to the substrate; and selectively removing one or more of the first doped SiGe layer or second doped SiGe layer through the channel.

17. The method of claim 16, wherein the first doped SiGe layer, second doped SiGe layer and doped silicon layer independently comprise a dopant in the range of 0.5-2.5%.

18. The method of claim 16, wherein each of the first doped SiGe layer, the second doped SiGe layer and the doped silicon layer are epitaxially grown.

19. The method of claim 16, wherein a stress of the second doped SiGe layer is more tensile than a stress of the first doped SiGe layer, and the stress of the first doped SiGe layer is more tensile than a stress of the doped silicon layer.

20. A method of making a 3D DRAM device with reduced wafer bowing, the method comprising:

forming at least 100 film stacks on a substrate surface, each of the film stacks comprising:

an epitaxially grown first doped SiGe layer having an empirical formula $Si_{1-x}Ge_x$, where x is in the range of greater than >0 to 0.5;

an epitaxially grown second doped SiGe layer on the first doped SiGe layer, the second doped SiGe layer having an empirical formula $S_{1-y}Ge_y$, where y is in the range of >0 to 0.5, the first doped SiGe layer and second doped SiGe layer have one or more of different doping amounts or different Si:Ge ratios; and an epitaxially grown doped silicon layer on the second doped SiGe layer, wherein the first doped SiGe layer, second doped SiGe layer and doped silicon layer independently comprise a dopant selected from carbon or boron in the range of 0.5-2.5%, wherein a stress of the second doped SiGe layer is more tensile than a stress of the first doped SiGe layer, and the stress of the first doped SiGe layer is more tensile than a stress of the Si layer, and wherein each of the first doped SiGe layer, the second doped SiGe layer and the doped silicon layer have an etch selectivity relative to the other layers by greater than 200:1 when using halide-based etchants;

forming a channel through all of the stacks to the substrate surface by lithography; and selectively etching one or more of the first doped SiGe layers or second doped SiGe layers from all of the film stacks through the channel.

* * * * *